US006229359B1

(12) United States Patent
Chesavage

(10) Patent No.: US 6,229,359 B1
(45) Date of Patent: May 8, 2001

(54) LOW PHASE NOISE CLOCK MULTIPLICATION

(75) Inventor: Jay A. Chesavage, Palo Alto, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/476,284

(22) Filed: Dec. 31, 1999

(51) Int. Cl.[7] .......................... H03B 19/00
(52) U.S. Cl. .......................... 327/116; 327/119
(58) Field of Search .......................... 327/116, 119, 327/122, 113

(56) References Cited

U.S. PATENT DOCUMENTS 4,877,974 10/1989 Kamai et al. .
5,530,387 6/1996 Kim .
5,563,530 10/1996 Mukoujima .
5,809,291 9/1998 Mundz-Bustanate et al. .
5,818,270 10/1998 Hamza .
5,920,211 7/1999 Anderson et al. .
6,147,525 * 11/2000 Mitani et al. .......................... 327/119

* cited by examiner

*Primary Examiner*—Toan Tran
*Assistant Examiner*—Linh Nguyen
(74) *Attorney, Agent, or Firm*—Jay A. Chesavage

(57) ABSTRACT

A generator of high frequency signals comprises a delay element and a switching element, whereby the delay element causes a delay of π/4 radians, and the switching element is switching to produce an output at the fundamental frequency, but with enriched even harmonic content. A filter selects the desired harmonic, and passes this on as an output. Additionally, a maximizing circuit may vary the phase of the delay element to maximize the output level of the generator.

22 Claims, 4 Drawing Sheets

150
1.0
−T1/2
0
T1/2

154
1.0
−T1
0
T1

158
1.0
−T1
0
T1

152
1.0
−5/T1
−3/T1
−1/T1
0
1/T1
3/T1
5/T1

156
1.0
−1/T1
0
1/T1

152'
162
1.0
164
166
168
170
172
−5/T1
−3/T1
−1/T1
0
1/T1
3/T1
5/T1

180
1.0
−T1/2
0
T1/2

184
1.0
−T1
0
T1

188
1.0
−T1
0
T1

182
0.5
−5/T1
−3/T1
−1/T1
0
1/T1
3/T1
5/T1

186
1.0
−1/T1
0
1/T1

190
0.5
192
198
182'
194
196
−5/T1
−3/T1
−1/T1
0
1/T1
3/T1
5/T1

LOW PHASE NOISE CLOCK MULTIPLICATION

FIELD OF THE INVENTION

The current invention is directed to a method of generating a clock signal that is an integral multiple of a fundamental frequency while introducing minimal additional time jitter or phase noise.

BACKGROUND OF THE INVENTION

There are many different methods of generating a clock that is an integral multiple of a fundamental frequency. One well known method is the use of a PLL and a frequency-phase detector with a feedback loop. Such devices are referenced in U.S. Pat. No. 5,809,291 and the book "Phase Locked Loops" by Floyd Gardner. One problem with phase locked loops is that the phase noise of the generated output signal is derived from the phase noise of the VCO which generates it, rather than from the low phase noise of the fundamental frequency oscillator which feeds it. This results in an interesting phenomenon whereby the phase noise of the output signal actually decreases very close to the fundamental frequency, where the lower noise and high loop gain of the error amplifier is able to produce an error signal which tracks the phase error of the VCO and feed this signal back into the noisy VCO, thereby making this part of the spectrum quieter. The VCO typically has a higher phase noise level than a crystal oscillator because the crystal oscillator has a much higher Q and is only able to operate in a very narrow range of frequencies, while the VCO has an intrinsically lower Q and can be modulated by small levels of electrical noise appearing on the control voltage input.

An alternate method of deriving a higher frequency signal from an input signal is the use of DLL (delay locked loop) oscillator, which comprises a chain of delay elements in a loop, each delay element controlled by a control voltage. Such systems are described in U.S. Pat. Nos. 5,818,270 and 5,920,211. In this type of system, the DLL is providing the intrinsic phase noise, and the system clock is merely a reference for the use of the comparator.

Another alternate method of deriving a higher frequency signal from an input signal involves the use of an exclusive OR gate with a delay line, as is described in U.S. Pat. No. 5,563,538. In this circuit, the objective is not the generation of a harmonic clock, but the extraction of a 2× clock from a clock-encoded optical signal of varying amplitude, typically from a photodiode of a communication system. In this reference, a delay line is combined with an exclusive OR gate to produce a 50% duty cycle signal at 2× the input frequency, and a SAW bandpass filter of high Q is provided afterwards to provide a sinusoidal output waveform at twice the output frequency.

OBJECTS OF THE INVENTION

A first object of the invention is the optimal generation of even harmonics from an input signal. A second object of the invention is the generation of a low phase noise harmonic which is derived from a fundamental input frequency source. A third object of the invention is the generation of even harmonics of an input signal whereby the duty cycle of the waveform is adaptively changed to maximize the output content of second harmonic power. A fourth object of the invention is the generation of a low phase noise output through the generation of second harmonic content of an input signal whereby the duty cycle of the input signal is varied to maximize the second harmonic content of the signal.

SUMMARY OF THE INVENTION

A periodic input signal having a period T is divided into a delayed and a normal signal. The delayed signal lags the normal signal by $\pi/2$ radians in phase or T/4 in time. The normal signal and the delayed signal are delivered to a switching element which may be an OR gate, an AND gate, or a D Flip Flop. The switching element creates an output duty cycle which is optimized for output power of the harmonic content of the desired signal, and may be the second harmonic of the fundamental frequency. A filter suppresses the fundamental frequency and passes on the harmonic energy to an output. Optionally, the output signal may be passed through an adaptive filter which detects a maximum level of second harmonic power, and provides an error signal to vary the delay element to produce an output with a maximum level of second harmonic signal energy.

DETAILED DESCRIPTION OF THE INVENTION

Figure 1:
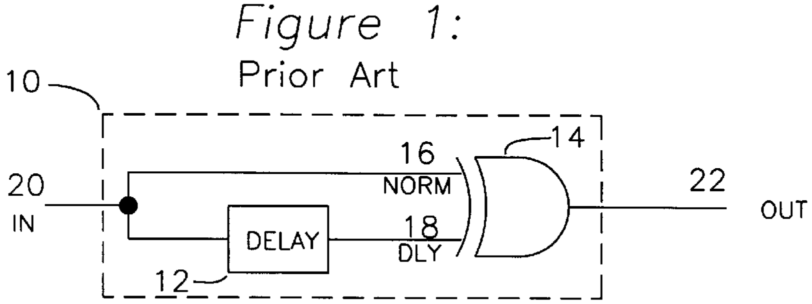
FIG. 1 is a schematic and block diagram for a prior art clock multiplier.

FIG. 1 shows a prior art frequency doubler 10. A periodic input signal 20 having a period T is applied to the input of delay element 12, as well as NORM (normal) input 16 of exclusive OR gate 14. The output of the delay element 12 is applied to DLY (delay) input 18 of exclusive OR gate 14. Typically, the phase delay of element 12 is $\pi/2$ radians, or the time value T/4, which produces a 50% duty cycle 2× frequency at output 22.

Figure 2:
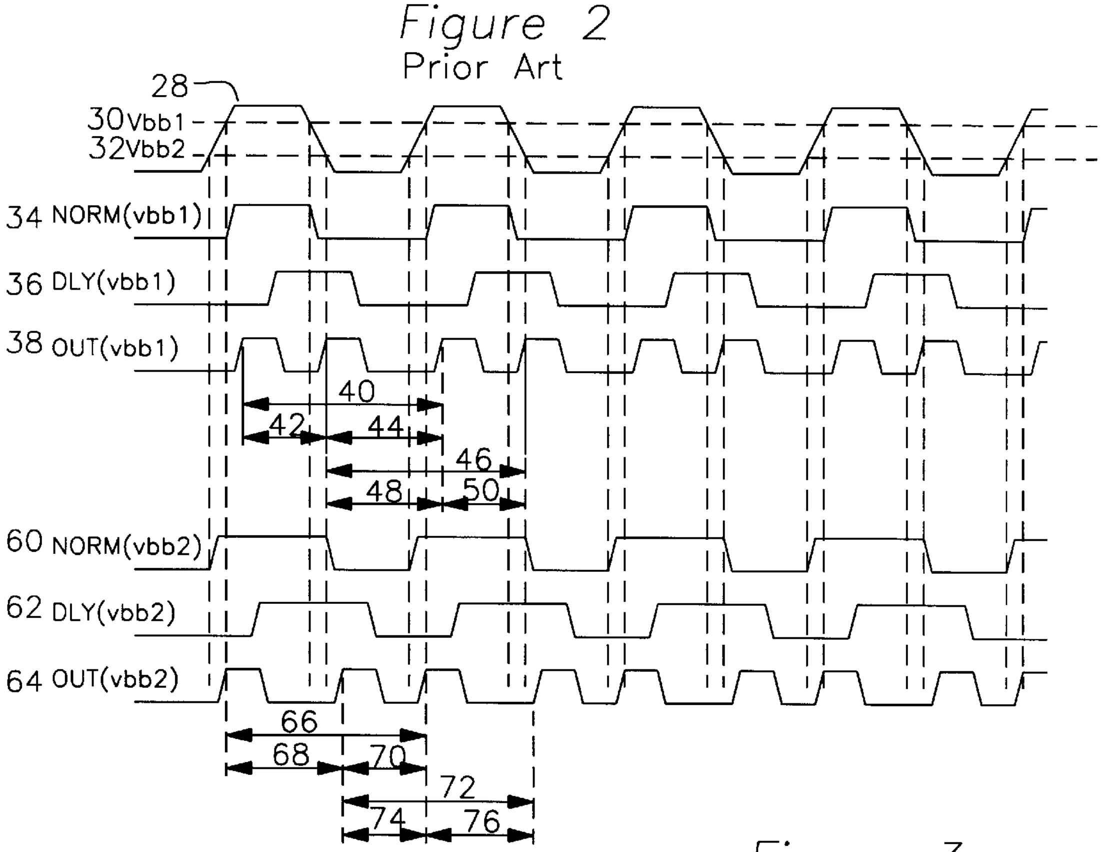
FIG. 2 shows the waveforms generated by FIG. 1.

FIG. 2 shows the waveforms of FIG. 1. The input signal 20 is shown as waveform 28. There are many sources of phase noise in a digital system. One such source is a variation in the switching threshold with variations in VCC caused by external noise injection, or due to thermal noise intrinsically present in the switching device. The effect of this noise is illustrated by examining the result of changing the switching thresholds shown as Vbb1 30 and Vbb2 32. Examining the first case where the threshold is Vbb1 30 in gate 14, the switching threshold seen by NORM input 16 is shown as waveform 34, where transitions are associated with input waveform 28 crossing threshold 30. The delayed signal associated with threshold Vbb1 delivered to the DLY input 18 is shown as waveform 36. The output produced by the exclusive OR gate 14 under this first threshold condition is shown in waveform 38. There is a cycle-skipping symmetry whereby Vbb1 30 controls the leading and falling edge times. This effect tends to vary the first cycle time 42 and second cycle time 44, but preserves the fundamental cycle time 40. Now, examining the case where input waveform is applied to a second reference Vbb2 32, waveform 60 shows the switching threshold seen by normal input 16, and delayed waveform 62 represents the input threshold seen by delayed input 18. As before, the fundamental cycle time 66 is preserved, but first cycle 68 and second cycle 70 have different periods referenced to each other, and to the periods associated with the first threshold Vbbl 30, as was illustrated in cycles 42 and 44 respectively. The significance of this cycle to cycle period asymmetry is clear to one skilled in the art of digital systems. Noise in the system, or variations in the threshold Vbb modulate both edges of the output 22. As the switching threshold changes from Vbb1 to Vbb2, the first edge of the output occurs earlier, which causes the first cycle time to grow, as can be seen comparing cycle 42 and 68 of waveforms 38 and 64, respectively. At the same time, the second edge cycle time is decreasing, as can be seen comparing period 44 to period 70 of waveforms 38 and 64, respectively. While digital systems are moderately tolerant of cycle to cycle variations which gradually accumulate occur over many cycles of operation, it is generally undesirable to have the system producing an output with asymmetrical cycle to cycle behavior, particularly when the asymmetry varies in opposite directions with switching thresholds, which are strongly effected by external noise and internal threshold noise.

Figure 3:
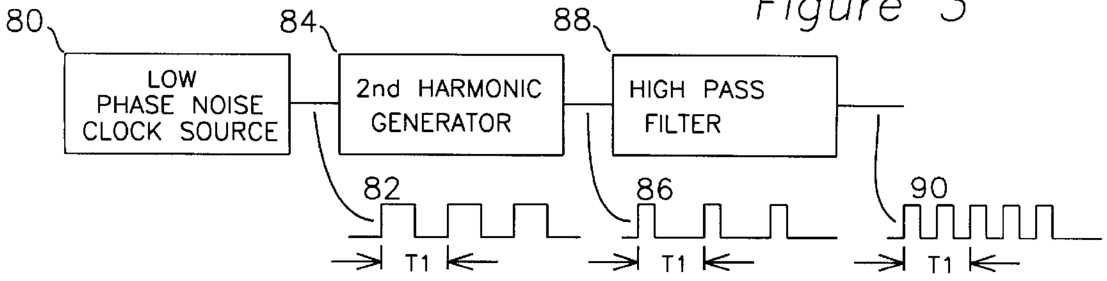
FIG. 3 is the block diagram low phase noise clock generator.

FIG. 3 shows a low phase noise clock source 80 producing a fundamental frequency output 82, as would be applied to the input 20 of FIG. 1. The low phase noise source 80 is followed by a second harmonic generator 84, which produces a 25% duty cycle wave of the same fundamental period T1, having a frequency of 1/T1. This is followed by a filter 88 which removes the fundamental frequency, leaving the second and higher order harmonic signals as shown in waveform 90. While it is important to remove the fundamental frequency, preserving the higher order odd harmonics which contribute to the fast edges in the switching threshold region of the waveform is preferred, since this reduces the jitter modulation caused by switching threshold noise.

Figure 4:
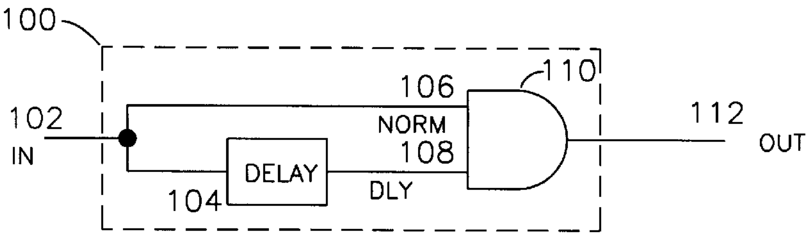
FIG. 4 is a schematic diagram for the harmonic generator of FIG. 3.

FIG. 4 shows a 2nd harmonic generator 100 corresponding to the generator 84 of FIG. 3. The generator 100 has an input 102 which produces a normal input 106, and a delayed input 108, which is produced by delay unit 104, and is preferably delayed in phase $\pi/2$ from the normal input 106. The normal signal 106 and delayed signal 108 are applied to the inputs of an AND gate 110, and produce output 112. One possible realization for element 104 could be a printed circuit board (pcb) trace length which is T/4 longer than the trace delivering normal signal 106. For example, an FR4 pcb substrate having an $\epsilon_r$=4.2 carries electrical signals at 6.8 ps/mm, so for an input frequency of 100 Mhz having a period T=10 ns, a T/4 delay of 2.5 ns could be produced by a PCB trace of 370 mm. This delay could be simply realized by delivering the delay input 108 on a pcb trace which is 370 mm longer than the trace providing the normal input. Gate 110 could be realized from the Motorola Semiconductor Inc., of Schaumburg, Ill. series of MC100Exxx series of PECL or ECL gates.

Figure 5:
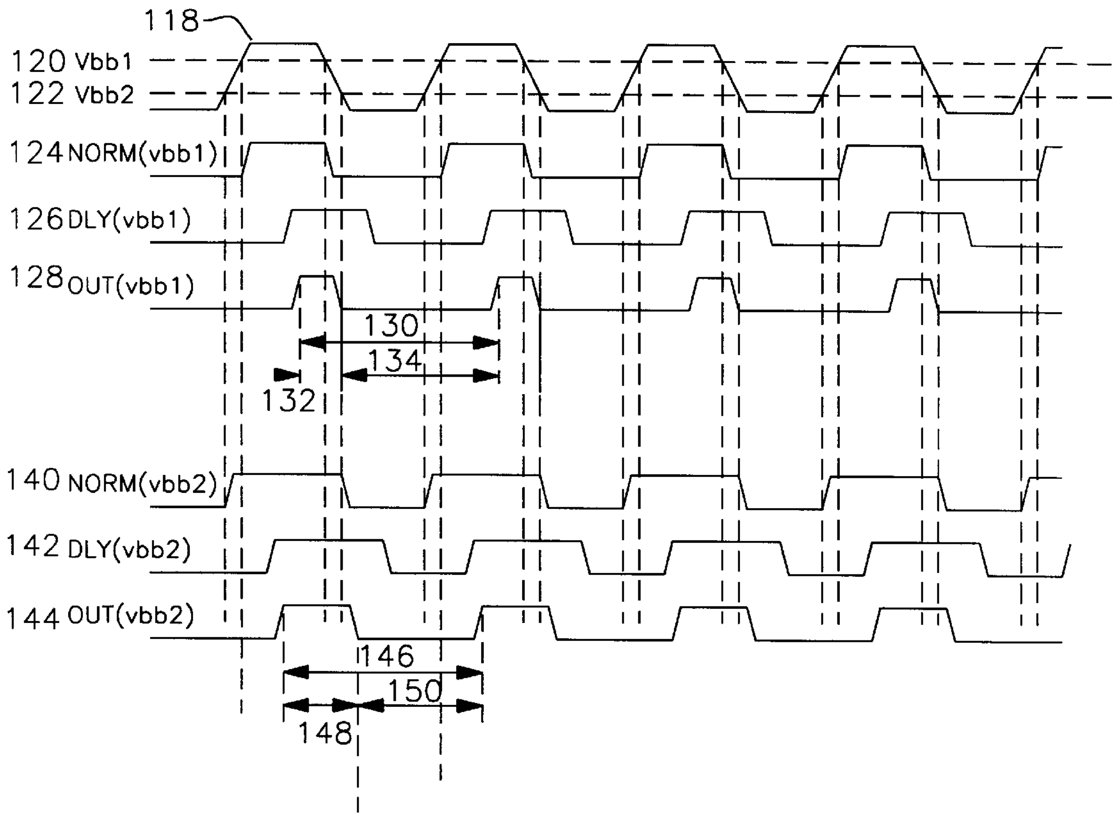
FIG. 5 shows the waveforms of FIG. 4.

FIG. 5 shows the waveforms of FIG. 4. Input waveform 118 is shown with thresholds Vbb1 120 and Vbb2 122 applied, as before. Examining first the case of switching threshold Vbb1, the normal waveform 124 of input 106 is shown with the delayed waveform 126 of input 108. These signals produce the output 112 waveform 128. Similarly, for input threshold Vbb2 122, the normal and delayed inputs are shown occurring earlier as waveforms 140 and 142, respectively, and the output is shown as waveform 144. It can be seen that changes in switching threshold change the duty cycle of the waveform, but not the fundamental frequency, as was shown in FIG. 2. This variation in duty cycle may slightly change the second harmonic content of the signal over time, but does not change it on a cycle to cycle basis, thereby preserving the phase purity of the second harmonic of the fundamental signal.

Figures 6A, 6B, 6C, 6D, 6E, 6F, 7A, 7B, 7C, 7D, 7E, 7F:
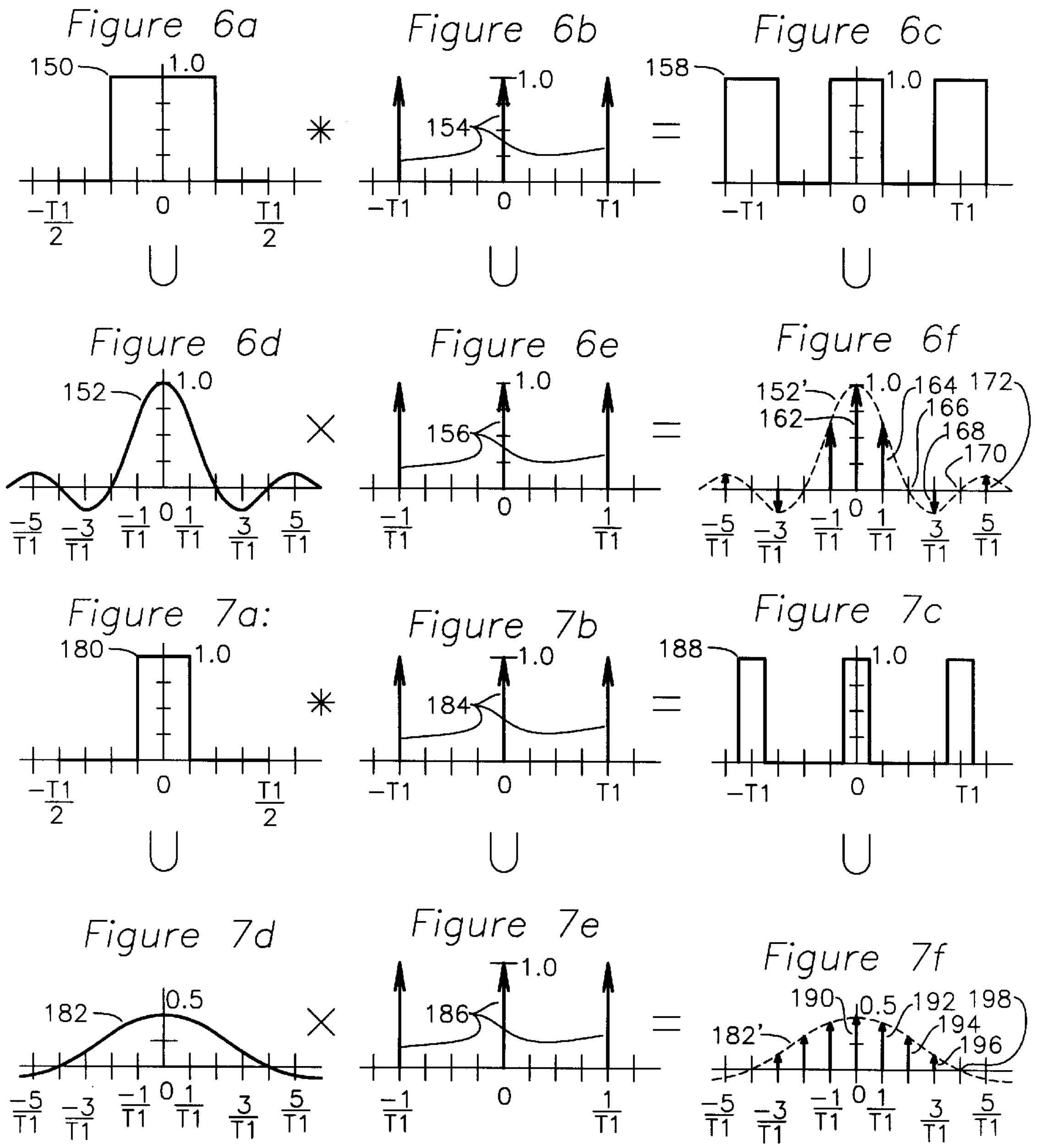
FIG. 6*a–f* shows the time and frequency domain relationships between signals for a 50% duty cycle waveform.
FIG. 7*a–f* shows the time and frequency domain relationships between signals for a 25% duty cycle waveform.

The operation of the present invention is best understood from the perspective of Fourier transform relationships as shown in FIGS. 6 and 7. FIG. 6*a* through 6*f* show the Fourier transform relationships between the duty cycle of a waveform and its harmonic content. The waveforms 6*a*, 6*b*, and 6*c* show the time domain waveforms, while waveforms 6*d*, 6*e*, and 6*f* show the frequency domain fourier transforms respectively of these waveforms. FIG. 6*a* shows the waveform 150, known as a rect(x) function, where rect(x)=1 for $-\frac{1}{2}<=x<=\frac{1}{2}$, and rect(x)=0 for all other x. FIG. 6*b* shows a shah(x) function 154, which is an infinitely repeating impulse function, shown with time spacing T1. The x scaling of FIG. 6*a* is chosen so that the convolution of FIG. 6*a* with FIG. 6*b* produces the 50% duty cycle continuous wave 158 with period T1 of FIG. 6*c*. The Fourier transform of the rect(x) function 150 of FIG. 6*a* produces the sinc(s) function 152 of FIG. 6*d* where $\mathrm{sinc}(s)=\sin(\pi s)/\pi s$. The function 152 of FIG. 6*d* has zeros at 2/T1, 4/T1, . . . 2n/T1. FIG. 6*e* shows the Fourier transform of FIG. 6*b*, which is also a shah(s) function 156, with frequency spacing of 1/T1. Convolution in the frequency domain corresponds to multiplication in the frequency domain, so applying waveform 152 of FIG. 6*d* to the shah function 156 of FIG. 6*e* produces the spectrum of FIG. 6*f*, with each frequency component shown as an arrow, and the dashed line 152' indicates the envelope formed by waveform 152. The impulse function 162 at 0 indicates the DC component, while the value at fundamental frequency 1/T1 is shown by 164, the value of second harmonic 166 is 0, the third harmonic is value 168, the fourth harmonic 170 is 0, and the fifth harmonic is value 172. Since these values correspond to the values of $\mathrm{sinc}(\pi fT1)/(\pi fT1)$, it can be seen that the odd harmonics have amplitude value 1/n, while the even harmonics have amplitude value 0.

FIG. 7 shows the analogous case for a 25% duty cycle waveform. FIG. 7*a* shows rect(2x) waveform 180, which is a time-scaled version of waveform 180. The resulting Fourier transform waveform is the $(\frac{1}{2})\mathrm{sinc}(\pi s/2)/(\pi s/2)$ waveform 182 shown in FIG. 7*d*. The shah waveforms 184 of FIG. 7*b* in the time domain and waveform 186 of FIG. 7*e* in the frequency domain is unchanged from the earlier case. FIG. 7*c* shows the time domain waveform 184, which is a 25% duty cycle square wave. FIG. 7*f* shows the new spectrum, which shows the effect of expanded envelope 182', including the reduction of the DC component 188 to ½ of its earlier value, and the introduction of even harmonic 192, which had the value 0 in the earlier case. Further decreasing the duty cycle waveform 180 is seen to reduce the amplitude of envelope 182', while broadening the envelope to include higher frequency components. For the case where we wish to maximize the second harmonic content of our output signal, we may chose to differentiate the function $$dy/da=(1/a)\{\sin(\pi fT1/a)\}/(\pi fT1/a)$$

for the second harmonic value f=2/T1 which produces a maximum second harmonic at a=½, we find maximum second harmonic content where the duty cycle=25%, as shown in FIG. 7*a*.

Figure 8:
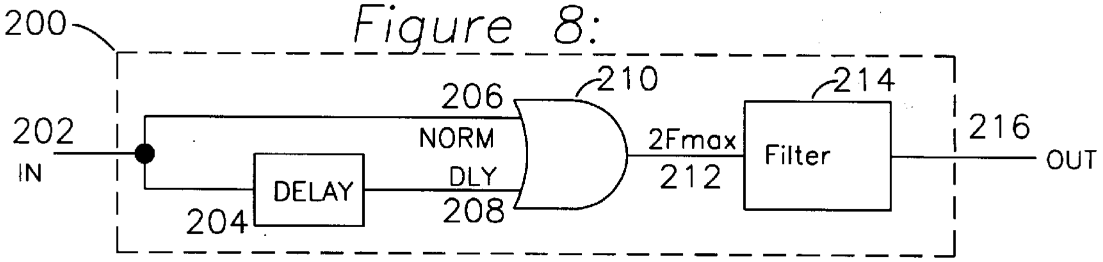
FIG. 8 shows a frequency generator having an OR gate generator and an output filter.

FIG. 8 shows a multiplier circuit 200 having an input 202, a delay element 204, an OR gate switching element 210 further having a normal input 206 and a delayed input 208 coupled to the output of the delay element 204. The OR gate 210 has an output 212 which is coupled to a filter 214 and produces the 2X frequency output 216.

Figure 9:
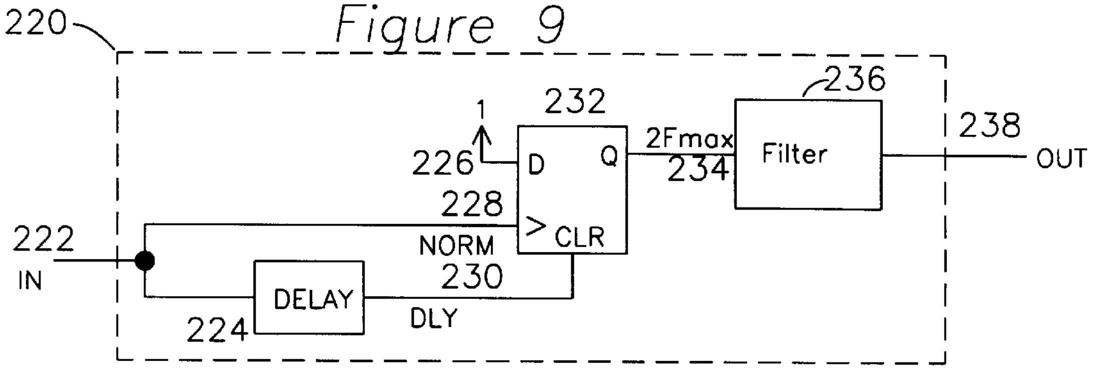
FIG. 9 shows a frequency generator with a D flip-flop generator and an output filter.

FIG. 9 shows a multiplier 220 having an input 222, a delay element 224 whose output 230 is coupled to the clear line of a D flip flop 232. The clock input 228 of flip flop 232 is coupled to the normal line, and the D input is tied to logic "1". This produces the modified duty cycle output 234, which is passed to filter 236, which filters out the fundamental frequency and produces output 238.

Figure 10:
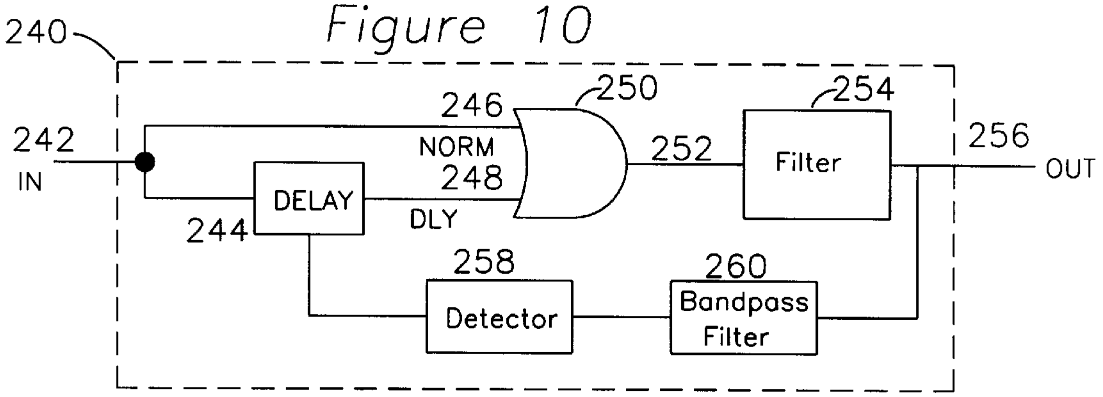
FIG. 10 shows a frequency generator with an OR gate generator, an output filter, and an output maximizing circuit comprising a bandpass filter and a detector.

FIG. 10 shows a multiplier 240 which is similar to the multiplier of FIG. 8, where the delay element 244 is controlled by the output of a bandpass filter 260 which selects the second harmonic of the output, and detects it with detector 258. In this realization, the detector 258 is used to modify the delay element 244 to maximize the value of second harmonic content.

Figure 11:
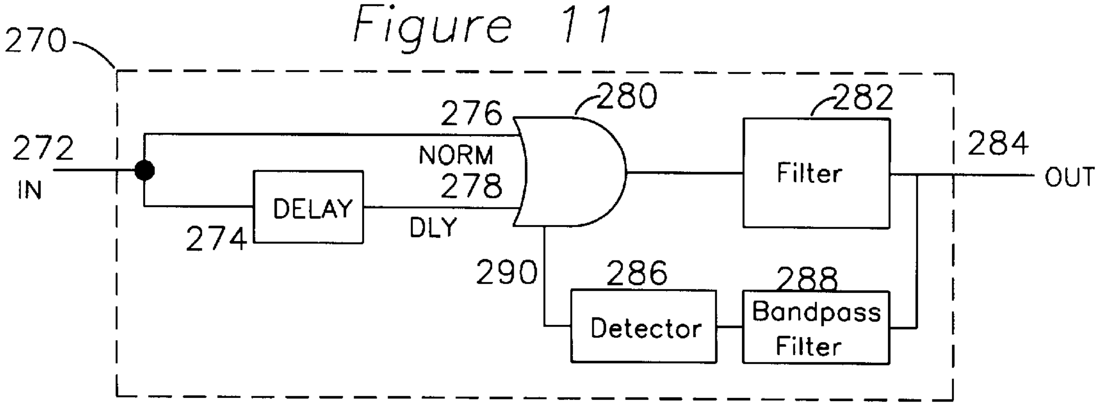
FIG. 11 shows a frequency generator having an OR gate generator, an output filter, and a harmonic maximizing circuit comprising a bandpass filter and a detector.

FIG. 11 shows a multiplier 270 which is similar to the multiplier of FIG. 9, where the switching element 280 has a threshold which is modified by a detector output 290. This detector output 290 is responsive to the maximum output signal produced by bandpass filter 288, which is examining the second harmonic content of the output 284.

The switching elements described previously could be realized using the Motorola line of PECL and ECL logic devices. One selection of devices could include the MC100E101 2 input OR gate, MC100E104 2 input AND gate, or the MC100E107 2 input exclusive OR gate. For applications where a variable delay input is required, such as element 280, the MC100E404 differential input AND gate could be used, where one differential input is used for the delivery of the input signal, and the other differential input is used for the delivery of a threshold voltage which would control the duty cycle, or the delay the switching point, as was described earlier. Variable delay lines such as element 244 are available from various manufacturers, such as Data Delay Devices, Inc., of Clifton, N.J.

In general, the desired characteristics of filter 214 would take as an input a spectrum such as that of FIG. 7*f*, and produce an output with the fundamental and even harmonics suppressed, while producing an output with maximally slewing edges, which would reduce the susceptability of the signal to phase degradation caused by the influence of additive noise. Such a filter could be realized with inductors and capacitors, as described in the book "Electronic Filter Design Handbook" by Williams.

It is clear to one skilled in the art that there are many different ways of fabricating delay lines, switching elements, and elements with variable delay. The examples offered in this specification are presented to assist in the understanding of the material, and are not meant to limit the particular implementation to those shown.

I claim:

1. A frequency multiplier having an input and an output, said frequency multiplier comprising:

said frequency multiplier input for coupling to a frequency source having a period T, said frequency multiplier input splitting into a normal signal and a delay signal;

a delay element having an input and an output, said frequency multiplier delay signal coupled to said delay element input, said delay element producing an output which is delayed in time from said delay element input by a value from T/10 to 9T/10;

a switching element having at least two inputs and an output, said inputs including a normal input coupled to said multiplier normal signal, and a delayed input coupled to said delay element output, the output of said switching element having a period T;

a filter having an input and an output, said filter input coupled to said switching element output, said filter output removing at least 50% of energy at frequency 1/T, and passing remaining said energy to said filter output;

said filter output coupled to said multiplier output.

2. The multiplier of claim 1 wherein said delay line comprises a printed circuit board trace having an electrical length of 0.25T.

3. The multiplier of claim 1 where said switching element is an OR gate.

4. The multiplier of claim 3 where said OR gate is a 2 input OR gate.

5. The multiplier of claim 4 where OR gate is either an ECL OR gate or a PECL OR gate.

6. The multiplier of claim 1 where said switching element is an AND gate.

7. The multiplier of claim 6 where said AND gate is a 2 input AND gate.

8. The multiplier of claim 7 where AND gate is either an ECL AND gate or a PECL AND gate.

9. The multiplier of claim 1 where said switching element is a D flip flop.

10. The multiplier of claim 9 where said D flip flop has a D input tied to a logic 1, a clock input tied to said multiplier normal signal, and a clear input tied to said delay element output.

11. A frequency multiplier having and input and an output, said frequency multiplier comprising:

said frequency multiplier input for coupling to a frequency source having a period T, said frequency multiplier input splitting into a normal signal and a delay signal;

a variable delay element having an input and an output, said frequency multiplier delay signal coupled to said variable delay element input, said delay element producing an output which is delayed in time from said delay element input by a value from T/10 to 9T/10 responsive to a control input;

a switching element having at least two inputs and an output, said inputs including a normal input coupled to said multiplier normal signal, and a delayed input coupled to said delay element output;

a filter having an input and an output, said filter input coupled to said switching element output, said filter output removing at least 50% of energy at a frequency 1/T, and passing remaining said energy to said filter output;

said filter output coupled to said multiplier output;

a bandpass filter coupled to said multiplier output said filter producing an output which contains exclusively all said multiplier output energy at a frequency of 2/T;

a detector coupled to said bandpass filter output and producing a control signal coupled to said variable delay control input;

said detector producing said control signal to maximize the content of said multiplier output frequency at said frequency 2/T.

12. The multiplier of claim 11 wherein said delay line comprises a variable delay line having a nominal delay of 0.25T.

13. The multiplier of claim 11 where said switching element is an OR gate.

14. The multiplier of claim 13 where said OR gate is a 2 input OR gate.

15. The multiplier of claim 14 where OR gate is either an ECL OR gate or a PECL OR gate.

16. The multiplier of claim 11 where said switching element is an AND gate.

17. The multiplier of claim 16 where said AND gate is a 2 input AND gate.

18. The multiplier of claim 17 where AND gate is either an ECL AND gate or a PECL AND gate.

19. The multiplier of claim 11 where said switching element is a D flip flop.

20. The multiplier of claim 19 where said D flip flop has a D input tied to a logic 1, a clock input tied to said multiplier normal signal, and a clear input tied to said variable delay element output.

21. The multiplier of claim 11 where said variable delay element is part of said switching element.

22. The multiplier of either claim 15 or 18 where said variable delay element comprises changing the threshold voltage of said switching element.

* * * * *